United States Patent
Lee

(10) Patent No.: US 9,666,813 B2
(45) Date of Patent: May 30, 2017

(54) FLEXIBLE DISPLAY DEVICE AND METHOD OF MANUFACTURING THE SAME

(71) Applicant: SAMSUNG DISPLAY CO., LTD, Yongin, Gyeonggi-Do (KR)

(72) Inventor: Keun-Soo Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/483,124

(22) Filed: Sep. 10, 2014

(65) Prior Publication Data

US 2015/0221883 A1    Aug. 6, 2015

(30) Foreign Application Priority Data

Feb. 3, 2014 (KR) .................. 10-2014-0012208

(51) Int. Cl.
  *H01L 51/00* (2006.01)
  *H01L 27/32* (2006.01)
(52) U.S. Cl.
  CPC ...... *H01L 51/0097* (2013.01); *H01L 27/3244* (2013.01); *H01L 51/003* (2013.01); *H01L 2251/5338* (2013.01); *Y02E 10/549* (2013.01); *Y02P 70/521* (2015.11)
(58) Field of Classification Search
  CPC . H01L 51/0097; H01L 51/56; H01L 27/3244; G02F 1/133305
  See application file for complete search history.

(56) References Cited

U.S. PATENT DOCUMENTS

| | | |
|---|---|---|
| 5,557,060 A | 9/1996 | Okada et al. |
| 2002/0098668 A1* | 7/2002 | Kim et al. ............. 438/584 |
| 2006/0081857 A1 | 4/2006 | Hong et al. |
| 2006/0145144 A1 | 7/2006 | Lee et al. |
| 2007/0194386 A1 | 8/2007 | Hahn et al. |
| 2009/0298211 A1* | 12/2009 | Kim et al. ............. 438/35 |
| 2010/0021720 A1* | 1/2010 | Shembel ......... C23C 14/0036 428/323 |
| 2010/0163878 A1* | 7/2010 | Haskal ......... G02F 1/133305 257/59 |
| 2011/0140089 A1* | 6/2011 | Terao ..................... 257/40 |
| 2013/0005059 A1 | 1/2013 | Song et al. |
| 2013/0168712 A1* | 7/2013 | Jeong et al. ............ 257/98 |

FOREIGN PATENT DOCUMENTS

| | | |
|---|---|---|
| KR | 10-2006-0050956 A | 5/2006 |
| KR | 10-2006-0080446 A | 7/2006 |
| KR | 10-2007-0082676 A | 8/2007 |
| KR | 10-2013-0006993 A | 1/2013 |

* cited by examiner

*Primary Examiner* — William F Kraig
*Assistant Examiner* — Khatib Rahman
(74) *Attorney, Agent, or Firm* — Lewis Roca Rothgerber Christie LLP

(57) ABSTRACT

A flexible display device includes a flexible substrate doped with a dopant so as to control a work function of the flexible substrate; a display unit formed on the flexible substrate, and including a plurality of pixel circuit layers and a plurality of emission layers; and an encapsulation layer formed to cover the display unit.

17 Claims, 7 Drawing Sheets

FLEXIBLE DISPLAY DEVICE AND METHOD OF MANUFACTURING THE SAME

CROSS-REFERENCE TO RELATED APPLICATION

This application claims priority to and the benefit of Korean Patent Application No. 10-2014-0012208, filed on Feb. 3, 2014, in the Korean Intellectual Property Office, the disclosure of which is incorporated herein in its entirety by reference.

BACKGROUND

1. Field

One or more embodiments of the present invention relate to a flexible display device and a method of manufacturing the same.

2. Description of the Related Art

The application of a liquid crystal display (LCD) device and/or an organic light-emitting display device that include a thin film transistor (TFT) is expanding to a display for a mobile device (such as a digital camera, a video camera, a personal digital assistant (PDA), a mobile phone, etc).

The display for the mobile device should have portability, thinness (thin thickness) and lightness to be applied to display devices having various forms, and flexibility to realize a curved surface. To do so, a plastic substrate is bonded on a support substrate and then processes for forming the display device are performed.

However, the aforementioned method causes a defect in a flexible display device due to delamination electrification while (during the process) the flexible display device is manufactured.

SUMMARY

Aspects according to one or more embodiments of the present invention are directed toward a flexible display device, and a method of manufacturing the same which have a high reliability.

Additional aspects will be set forth in part in the description which follows and, in part, will be apparent from the description, or may be learned by practice of the presented embodiments.

According to one or more embodiments of the present invention, a flexible display device includes a flexible substrate doped with a dopant to control a work function of the flexible substrate; a display unit on the flexible substrate, and including a plurality of pixel circuit layers and a plurality of emission layers; and an encapsulation layer to cover the display unit.

The work function of the flexible substrate may be controlled by adjusting a type of the dopant and a concentration of the dopant.

The dopant may be an n-type dopant or a p-type dopant.

Each of the plurality of emission layers may be formed in a manner that a first electrode, an organic layer, and a second electrode are sequentially stacked.

The flexible substrate may include at least one material selected from polyethylene ether phthalate, polyethylene naphthalate, polycarbonate, polyarylate, polyetherimide, polyether sulfone, and polyimide.

The flexible display device may further include a buffer layer between the flexible substrate and the display unit.

According to one or more embodiments of the present invention, a method of manufacturing a flexible display device includes disposing a flexible substrate on a stage; doping a dopant on the flexible substrate; forming a display unit including a plurality of pixel circuit layers and a plurality of emission layers on the flexible substrate doped with the dopant; forming an encapsulation layer to cover the display unit; and delaminating the flexible substrate from the stage.

The doping of the dopant may include controlling a work function of the flexible substrate by adjusting a type of the dopant and a concentration of the dopant.

The dopant may be an n-type dopant or a p-type dopant.

The flexible substrate may include at least one material selected from polyethylene ether phthalate, polyethylene naphthalate, polycarbonate, polyarylate, polyetherimide, polyether sulfone, and polyimide.

The disposing of the flexible substrate may include disposing a supporting substrate on the stage; and disposing the flexible substrate on the supporting substrate.

The doping of the dopant may include doping the dopant on the flexible substrate whereby a work function of the flexible substrate and a work function of the supporting substrate become substantially equal to each other.

When a work function of the flexible substrate is greater than a work function of the supporting substrate, the doping of the dopant may include decreasing the work function of the flexible substrate by doping an n-type dopant on the flexible substrate.

When a work function of the flexible substrate is less than a work function of the supporting substrate, the doping of the dopant may include increasing the work function of the flexible substrate by doping a p-type dopant on the flexible substrate The supporting substrate may include a glass substrate.

Each of the plurality of emission layers may be formed in a manner that a first electrode, an organic layer, and a second electrode are sequentially stacked.

The first electrode may be an anode, and the second electrode may be a cathode.

The encapsulation layer may include an organic layer stacked and alternating with an inorganic layer, or a multi-stack inorganic layer.

The method may further include forming a buffer layer on the flexible substrate doped with the dopant after the doping of the dopant on the flexible substrate and prior to the forming of the display unit.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
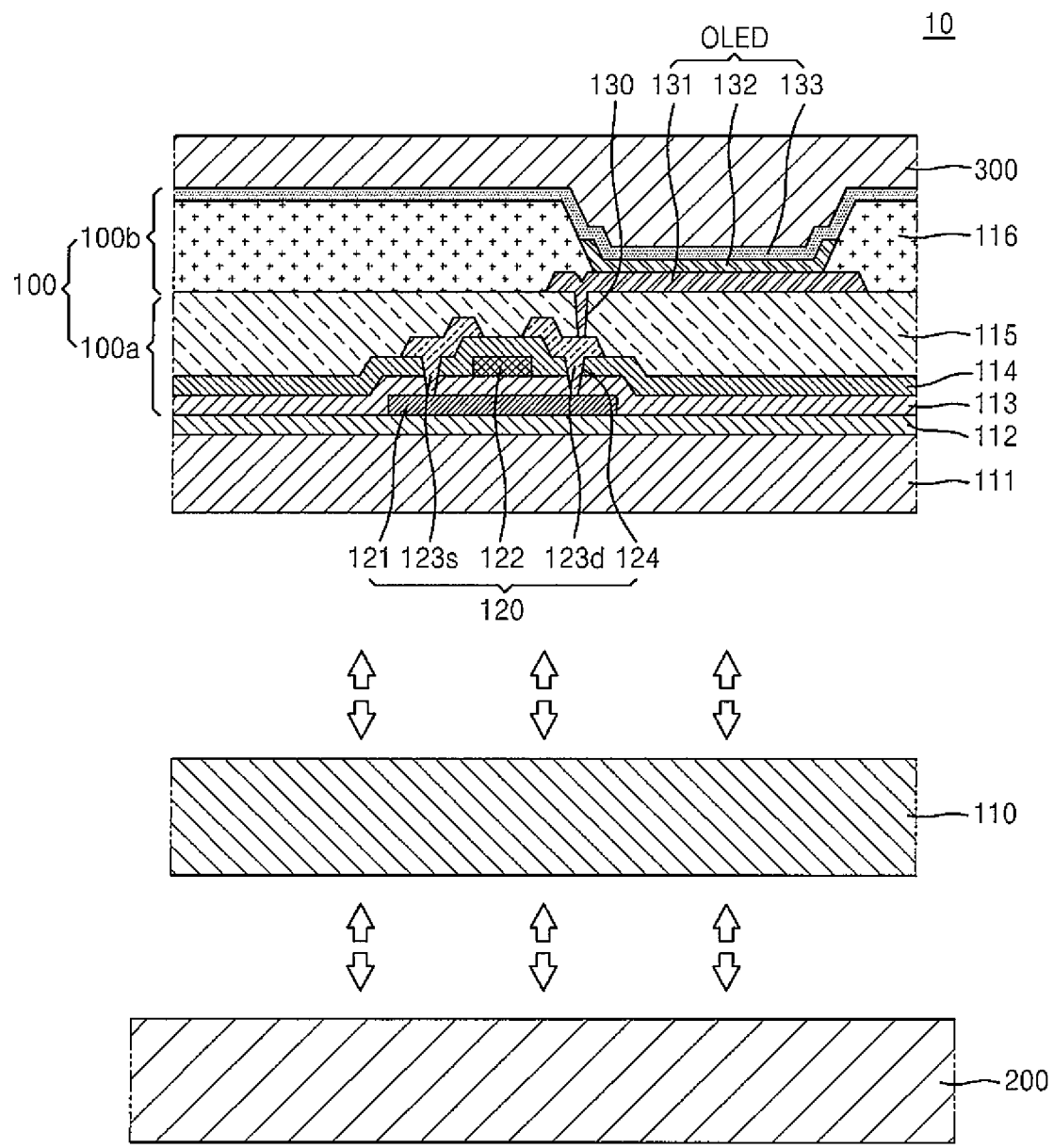
FIG. 1 is a cross-sectional view of a flexible display device according to an embodiment of the present invention.

As the invention allows for various changes and numerous embodiments, particular embodiments will be illustrated in the drawings and described in more detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are not provided when it is deemed that they may unnecessarily obscure the essence of the invention.

While such terms as "first," "second," etc., may be used to describe various components, such components must not be limited to the above terms. The above terms are used only to distinguish one component from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

In the drawings, the thicknesses of layers and regions are exaggerated for clarity. Also, throughout the specification, it will also be understood that when an element such as a layer, film region, substrate, etc. is referred to as being "on" another element, it can be directly on the other element, or intervening elements may also be present.

Reference will now be made in more detail to embodiments, examples of which are illustrated in the accompanying drawings. Expressions such as "at least one of," when preceding a list of elements, modify the entire list of elements and do not modify the individual elements of the list. Further, the use of "may" when describing embodiments of the present invention refers to "one or more embodiments of the present invention." Also, as used herein, the term "substantially" is used as a term of approximation, and is intended to account for inherent deviations in measured or calculated values, as would be recognized by those of ordinary skill in the art.

FIG. 1 is a cross-sectional view of a flexible display device 10 according to an embodiment of the present invention.

Referring to FIG. 1, the flexible display device 10 includes a flexible substrate 111, and a display unit 100 and an encapsulation layer 300 that are sequentially formed on the flexible substrate 111.

The flexible substrate 111 is a flexible substrate that is doped with a dopant and formed of an insulating material. For example, the flexible substrate 111 may be formed of a plastic material including polyethylene ether phthalate, polyethylene naphthalate, polycarbonate, polyarylate, polyetherimide, polyether sulfone, polyimide, or the like which has excellent heat-resistance and durability, and may be formed as a curved surface. However, one or more embodiments of the present invention are not limited thereto.

The dopant may be an n-type (n-channel) dopant (such as P or As), or a p-type (p-channel) dopant (such as B, $BF_2$ or Ga). However, one or more embodiments of the present invention are not limited thereto, and different types (kinds) of dopant may be used (utilized) as the n-type dopant or the p-type dopant.

According to a material of the flexible substrate 111 and a material of a supporting substrate 110, a type (kind) of the dopant and a concentration of the dopant may vary. The supporting substrate 110 may be a glass substrate.

After a manufacturing procedure is complete, the flexible display device 10 is separated from a stage 200, and a delamination process is performed so that the flexible substrate 111 of the flexible display device 10 is delaminated from the supporting substrate 110.

When the supporting substrate 110 is delaminated from the stage 200, a high delamination electrification voltage is generated between the supporting substrate 110 and the stage 200, which may cause a defect. That is, since the flexible substrate 111 on the supporting substrate 110 is formed of a material (such as polyimide) having a high work function compared to the supporting substrate 110, a delamination electrification voltage increases at a contact surface between the stage 200 and the supporting substrate 110 that supports the flexible display device 10, such that a possibility that defects may occur is further increased.

According to the present embodiment, in order to decrease a delamination electrification voltage that is generated when the stage 200 and the supporting substrate 110 are delaminated from or laminated to each other, the dopant may be doped (into the flexible substrate 111) so that the flexible substrate 111 may have a work function value equal or similar to that of the supporting substrate 110.

Figure 2A:
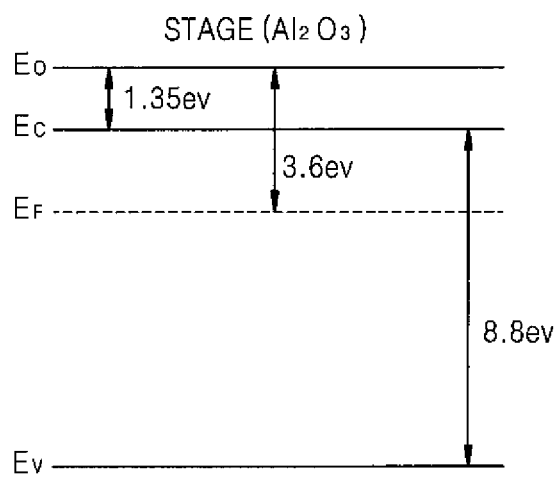
FIG. 2A illustrates a work function of $Al_2O_3$ in a case where the $Al_2O_3$ is used (utilized) as a stage.
Figure 2B:
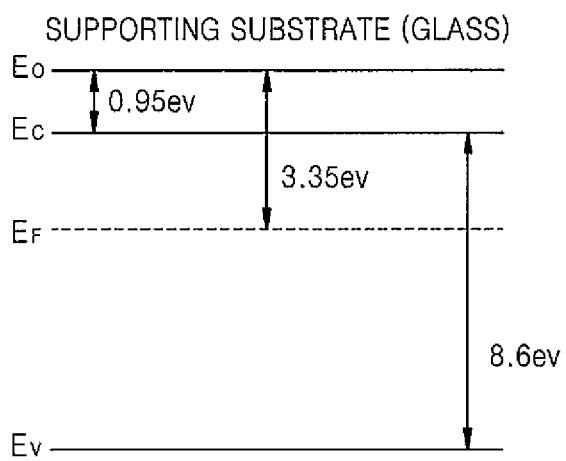
FIG. 2B illustrates a work function of a glass in a case where the glass is used (utilized) as a supporting substrate.
Figure 2C:
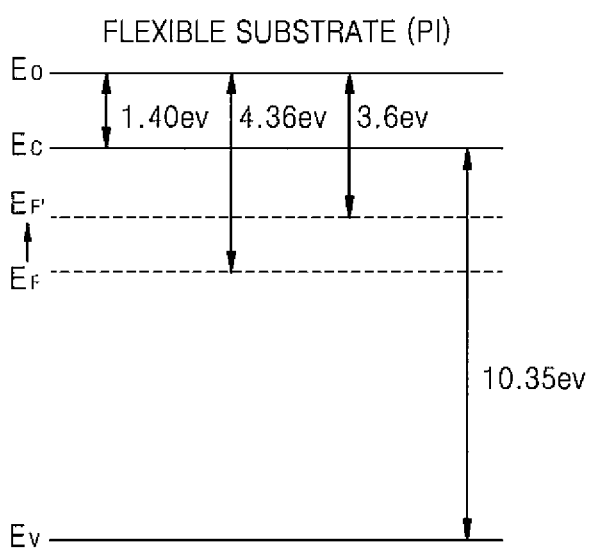
FIG. 2C illustrates a work function of polyimide in a case where the polyimide is used (utilized) as a flexible substrate.

FIG. 2A illustrates a work function of $Al_2O_3$ in a case where the $Al_2O_3$ is used (utilized) as the stage 200, FIG. 2B illustrates a work function of a glass in a case where the glass is used (utilized) as the supporting substrate 110, and FIG. 2C illustrates a work function of polyimide in a case where the polyimide is used (utilized) as the flexible substrate 111.

Referring to FIGS. 2A through 2C, it is apparent that the work function of the flexible substrate 111 (4.36 eV) has a value greater than a value of the work function of the supporting substrate 110 (3.35 eV), or a value of the work function of the stage 200 (3.6 eV).

Thus, in order to decrease the delamination electrification voltage, a Fermi level $E_F$ of the flexible substrate 111 has to be moved toward $E_C$ by a value of $E_F'$, so that the work function of the flexible substrate 111 (4.36 eV) may have a value equal or similar to the value of the work function of the supporting substrate 110 (3.35 eV). To do so, an n-type dopant may be doped on polyimide (that is formed as the flexible substrate 111). By reducing or preventing an increase of the delamination electrification voltage by reducing or minimizing a difference between the work function of the flexible substrate 111 and the work function of the supporting substrate 110, a defect of the flexible display device 10 may be reduced or prevented.

Although the n-type dopant is doped on the polyimide according to the work function of the flexible substrate 111 (formed of the polyimide) and the work function of the supporting substrate 110 (formed of the glass), one or more embodiments of the present invention are not limited thereto, and thus, a type of the dopant and a concentration of the dopant to be doped on the flexible substrate 111 may vary according to work functions of the materials that are formed as the flexible substrate 111 and the supporting substrate 110.

For example, if a work function of the flexible substrate 111 is less than a work function of the supporting substrate 110, the flexible substrate 111 may be doped with a p-type dopant so that the work function of the flexible substrate 111 may become substantially equal to (e.g., equal) the work function of the supporting substrate 110.

Referring back to FIG. 1, the display unit 100 includes a pixel circuit layer 100*a* and an emission layer 100*b*.

The pixel circuit layer 100*a* formed on the flexible substrate 111 may include a driving thin-film transistor (TFT) and a switching TFT that drive a plurality of organic light-emitting devices (OLEDs) formed on the emission layer 100*b*.

The encapsulation layer 300 formed on the display unit 100 may be formed of at least one organic layer and at least one inorganic layer that are staked and alternating with each other, or may be formed of a multi-stack inorganic layer. The encapsulation layer 300 reduces or prevents foreign oxygen and moisture from penetrating into the OLEDs.

A buffer layer 112 may be further formed between the flexible substrate 111 and the display unit 100. The buffer layer 112 may be formed of at least one of an inorganic layer and an organic layer. The buffer layer 112 may reduce or prevent foreign substances such as oxygen or moisture from penetrating into the display unit 100 by passing through the flexible substrate 111.

FIGS. 3 through 10 are cross-sectional views that schematically illustrate a method of manufacturing a flexible display device, according to an embodiment of the present invention.

Figure 3:
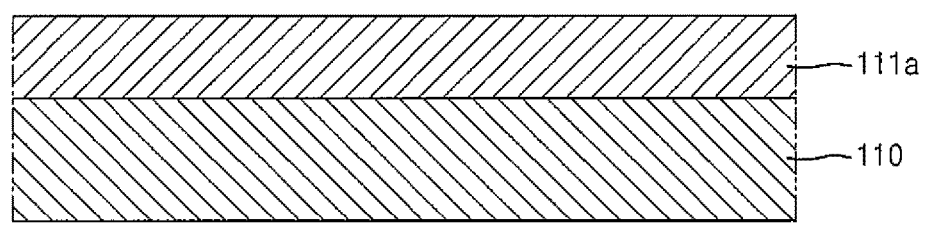
FIGS. 3 through 10 are cross-sectional views that schematically illustrate a method of manufacturing a flexible display device, according to an embodiment of the present invention.

Referring to FIG. 3, the supporting substrate 110 is arranged, and then a flexible substrate 111*a* is formed on the supporting substrate 110.

Figure 4:
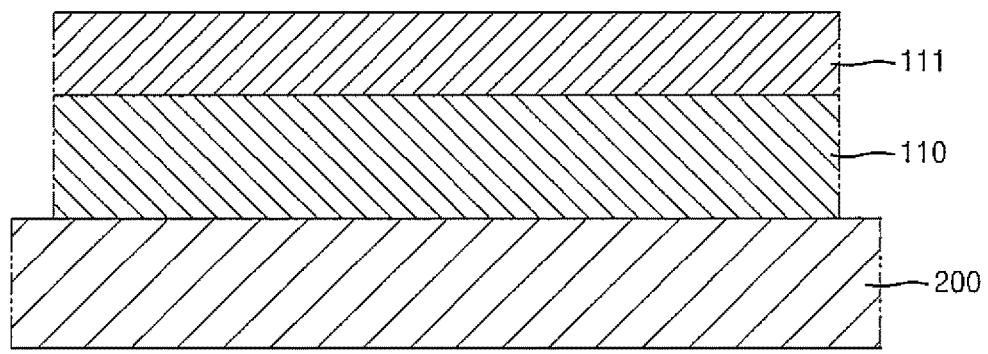

Referring to FIG. 4, the supporting substrate 110 is disposed on the stage 200.

Then, in order to make a work function of the flexible substrate 111 equal or similar to a work function of the supporting substrate 110, a process of doping a dopant on the flexible substrate 111*a* (refer to FIG. 3) is performed.

The dopant may be an n-type dopant or a p-type dopant, and a type (kind) and a concentration of the dopant may vary according to types (kinds) and work functions of the flexible substrate 111*a* and the supporting substrate 110, respectively.

For example, in a case where a work function of a glass that is formed as the supporting substrate 110 is 3.35 eV, and a work function of polyimide that is formed as the flexible substrate 111*a* is 4.36 eV, in order to decrease the work function of the flexible substrate 111*a*, the flexible substrate 111*a* may be doped with an n-type dopant, and thus a Fermi level of the flexible substrate 111*a* may become closer to a valence band.

In the present embodiment, the supporting substrate 110 is disposed on the stage 200 and then the flexible substrate 111*a* (refer to FIG. 3) is doped with the dopant. However, one or more embodiments of the present invention are not limited thereto, and thus the flexible substrate 111*a* that is doped with the dopant may be disposed on the supporting substrate 110, or a material including the dopant may be coated on the supporting substrate 110, and then the flexible substrate 111*a* may be formed thereon.

Figure 5:
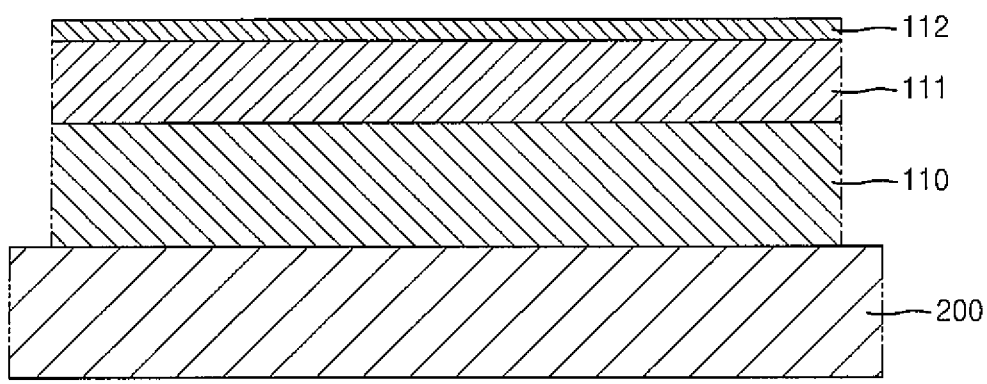

Next, referring to FIG. 5, the buffer layer 112 may be formed on the flexible substrate 111. The buffer layer 112 may be formed of at least one of an inorganic layer and an organic layer.

Figure 6:
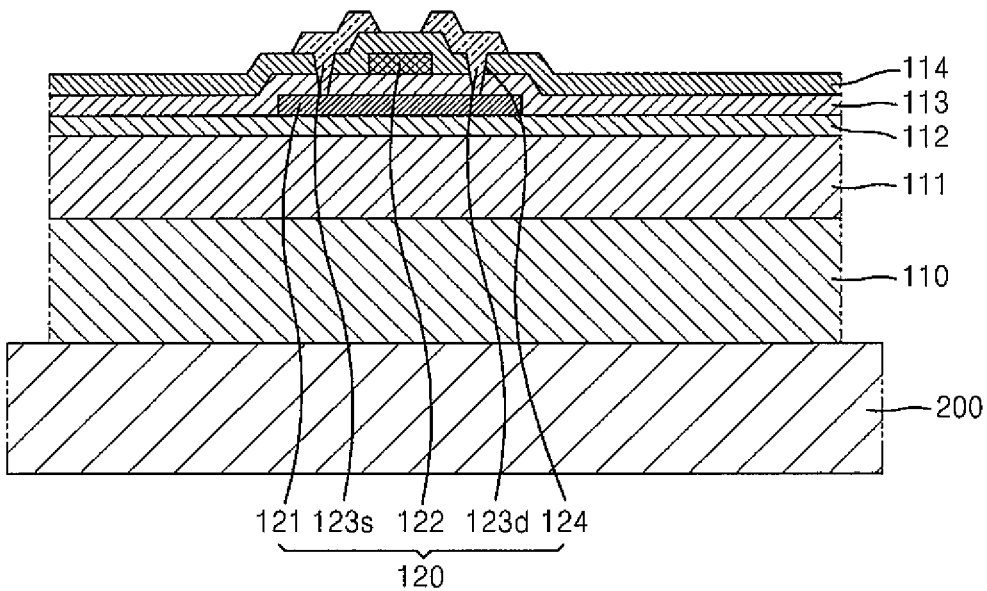

Next, referring to FIG. 6, a TFT 120 is formed on the buffer layer 112. FIG. 6 illustrates a top-gate TFT as an example of the TFT 120. However, a TFT having a different structure such as a bottom-gate TFT may be arranged.

Hereinafter, for convenience of description, it is assumed that the TFT 120 corresponds to the top-gate TFT shown in FIG. 6.

When the top-gate TFT is arranged, a semiconductor layer 121, a gate insulating layer 113, a gate electrode 122, an interlayer insulating layer 114, contact holes 124, a source electrode 123*s*, and a drain electrode 123*d* are formed on the buffer layer 112.

The semiconductor layer 121 may be formed of polysilicon and may have a set or predetermined region doped with impurity. The semiconductor layer 121 may not be formed of polysilicon, but may be formed of amorphous silicon or various suitable organic semiconductor materials including pentacene.

If the semiconductor layer 121 is formed of polysilicon, amorphous silicon is first formed and then is crystallized into polysilicon. This crystallization may be performed by using (utilizing) one of various suitable methods including a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, and the like.

The gate insulating layer 113 is formed between the semiconductor layer 121 and the gate electrode 122 so as to insulate them from each other. The gate insulating layer 113 may be formed of an insulating material including silicon oxide or silicon nitride, or may be formed of an insulating organic material.

The gate electrode 122 may be formed of various suitable conductive materials. For example, the gate electrode 122 may be formed of Mg, Al, Ni, Cr, Mo, W, MoW, and/or the like, and the gate electrode 122 may have a single or a multi-stack layer structure.

The interlayer insulating layer 114 may be formed of an insulating material including silicon oxide or silicon nitride, or may be formed of an insulating organic material. By selectively removing the interlayer insulating layer 114 and the gate insulating layer 113, the contact holes 124 that expose source and drain regions may be formed. Then, a material for forming the gate electrode 122 is stacked on the interlayer insulating layer 114 in a single or multiple layer structure so as to fill the contact holes 124, so that the source electrode 123*s* and the drain electrode 123*d* are formed. A cleaning process is performed after the gate electrode 122, the source electrode 123*s*, and the drain electrode 123*d* are formed, and during the cleaning process, the stage 200 and the supporting substrate 110 may be delaminated from each other. Here, as described above, since the flexible substrate 111 that was doped with the dopant having a work function value equal or similar to that of the supporting substrate 110 is arranged (utilized), an occurrence of a high delamination electrification voltage may be reduced or prevented, so that a reliability of the flexible display device may be increased.

Figure 7:
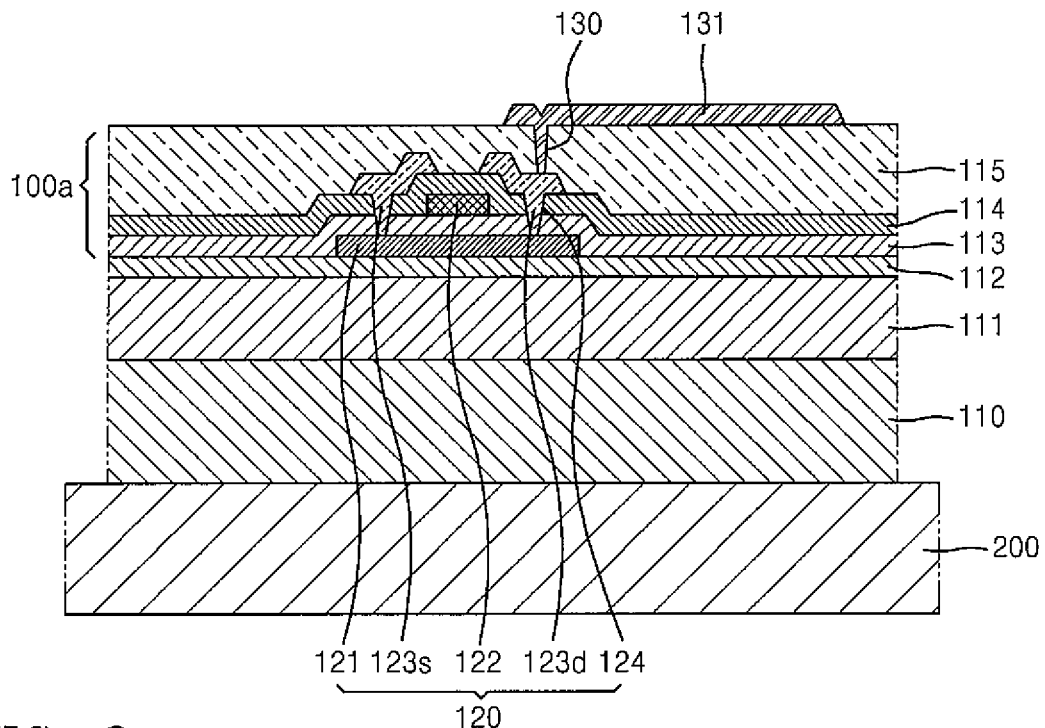

Referring to FIG. 7, a planarization layer 115 is formed on the source electrode 123*s* and the drain electrode 123*d*, so that the pixel circuit layer 100*a* is formed.

The planarization layer 115 protects the TFT 120 therebelow and planarizes a top surface of the TFT 120.

The planarization layer 115 may be variously formed (i.e., formed utilizing various suitable materials and structures). For example, the planarization layer 115 may be formed of an organic material including benzocyclobutene (BCB), acryl, etc., or an inorganic material including SiNx. The planarization layer 115 may have a single-layer structure, a double-layer structure, or a multilayer structure.

A first electrode 131 is formed on the planarization layer 115, and is electrically connected to the drain electrode 123d via the contact hole 124. The first electrode 131 may function as an anode or a cathode, and may be formed of various suitable conductive materials.

The first electrode 131 may be formed as a transparent electrode or a reflective electrode, depending on an emission type (kind). When the first electrode 131 is used (utilized) as the transparent electrode, the first electrode 131 may be formed of ITO, IZO, ZnO and/or $In_2O_3$; and when the first electrode 131 is used (utilized) as the reflective electrode, the first electrode 131 may be formed in a manner that a reflective layer is formed of Ag, Mg, Al, Pt, Pd, Au, Ni, Nd, Ir, Cr, and/or a compound of any of these, and then ITO, IZO, ZnO and/or $In_2O_3$ may be formed on the reflective layer.

Figure 8:
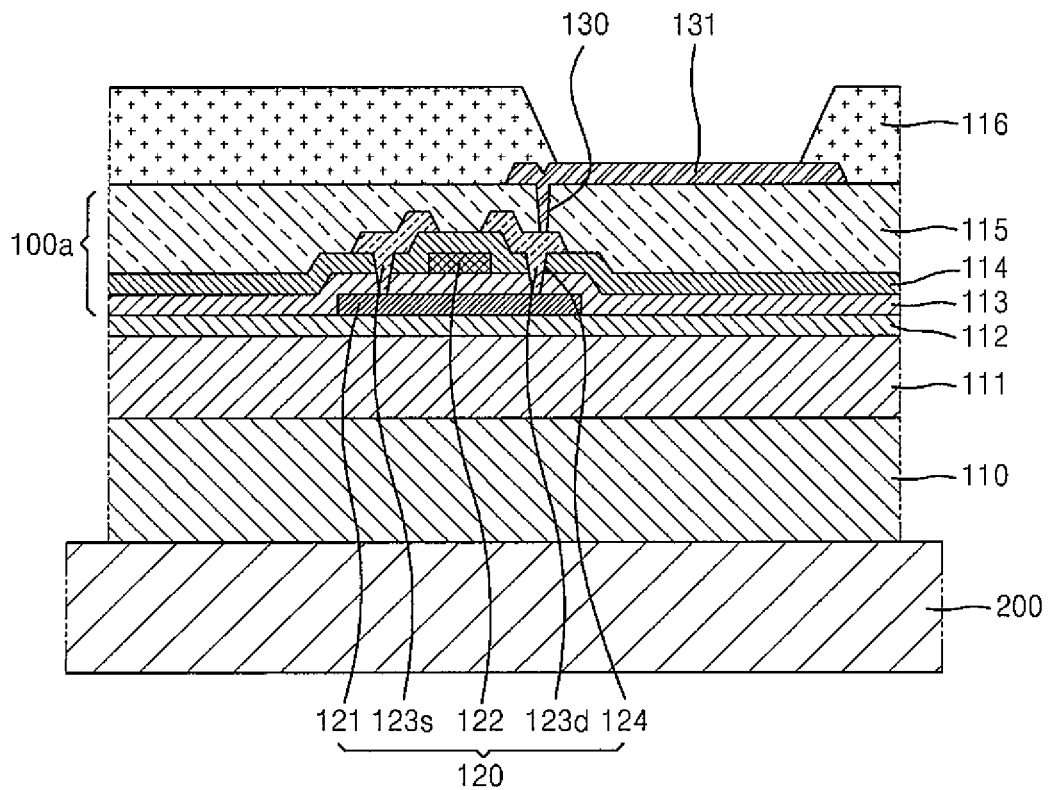

Next, referring to FIG. 8, a pixel defining layer 116 that is patterned by using (utilizing) an insulating layer is formed on the first electrode 131 so as to expose a portion of the first electrode 131.

The pixel defining layer 116 may be formed as an organic layer or an inorganic layer. When the pixel defining layer 116 is an inorganic layer, the pixel defining layer 116 may be formed of a material selected from inorganic materials including silicon oxide ($SiO_2$), silicon nitride ($SiN_x$), etc. When the pixel defining layer 116 is an organic layer, the pixel defining layer 116 may include an acryl-based polymer such as polymethyl methacrylate (PMMA), polystyrene (PS), a polymer derivative having a phenol group, an imide-based polymer, an allyl ether-based polymer, an amide-based polymer, a fluorine-based polymer, a p-xylene-based polymer, a vinylalcohol-based polymer, or a combination thereof.

Figure 9:
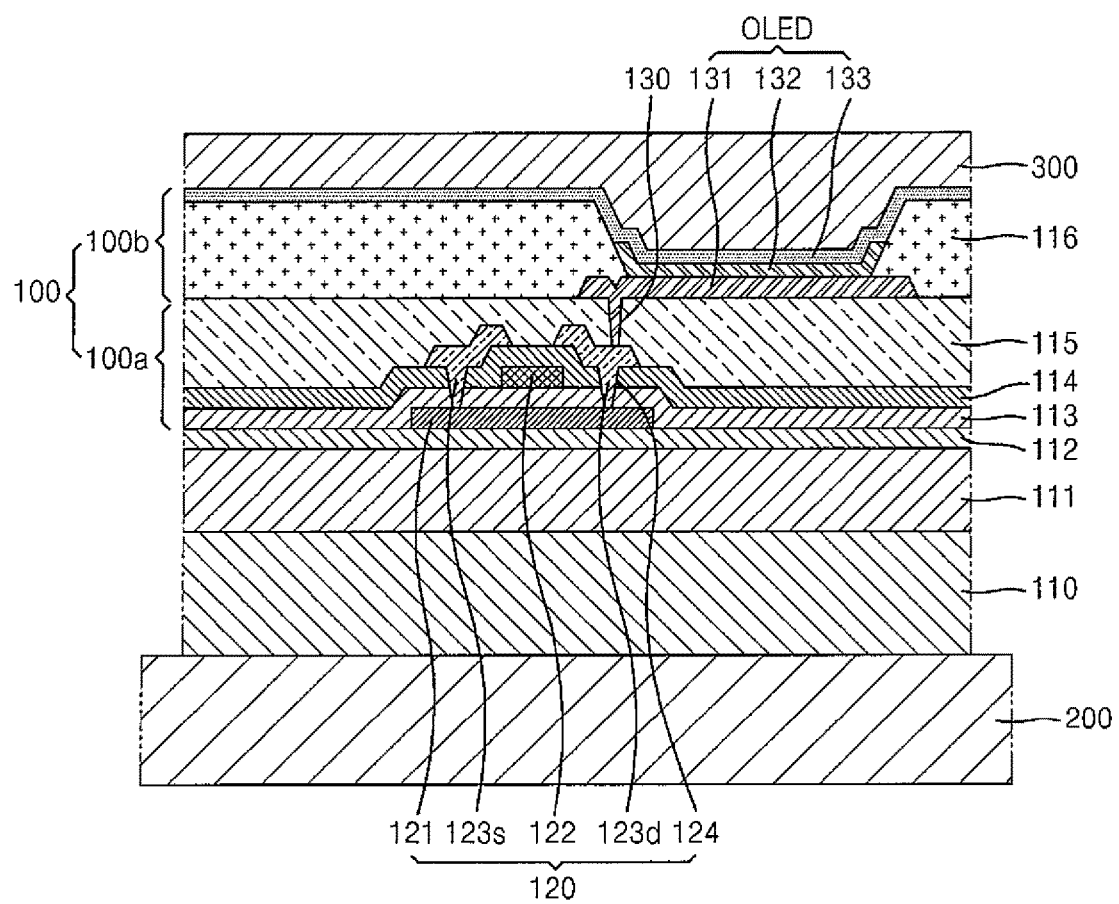

Next, referring to FIG. 9, an organic layer 132 including an emitting material is formed in an opening of the first electrode 131, and a second electrode 133 is formed to face the first electrode 131 with respect to the organic layer 132, so that an OLED may be formed. The organic layer 132 may further include at least one of a hole injection layer (HIL), a hole transport layer (HTL), an electron transport layer (ETL), and an electron injection layer (EIL).

Referring to FIG. 9, the organic layer 132 is patterned to only correspond to each sub-pixel, i.e., the first electrode 131, but this structure is shown for convenience of description, and thus the organic layer 132 may be integrally formed with an organic layer 132 of an adjacent sub-pixel. Alternatively, some of the layers of the organic layer 132 may be formed with respect to each sub-pixel, and other layers of the organic layer 132 may be integrally formed with the organic layer 132 of the adjacent sub-pixel.

The second electrode 133 may function as a cathode or an anode according to a function of the first electrode 131. Similar to the first electrode 131, the second electrode 133 may be formed as a transparent electrode or a reflective electrode. When the second electrode 133 is used (utilized) as the transparent electrode, the second electrode 133 may have a structure in which a layer is formed of Li, Ca, LiF/Ca, LIF/Al, Al, Mg, and/or a compound of any of these, and an auxiliary electrode or bus electrode line formed of a transparent electrode forming material such as ITO, IZO, ZnO and/or $In_2O_3$ is formed on the layer. When the second electrode 133 is used (utilized) as the reflective electrode, the second electrode 133 is formed in a manner that Li, Ca, LiF/Ca, LIF/Al, Al, Mg, and/or a compound of any of these is deposited on a whole surface.

Figure 10:
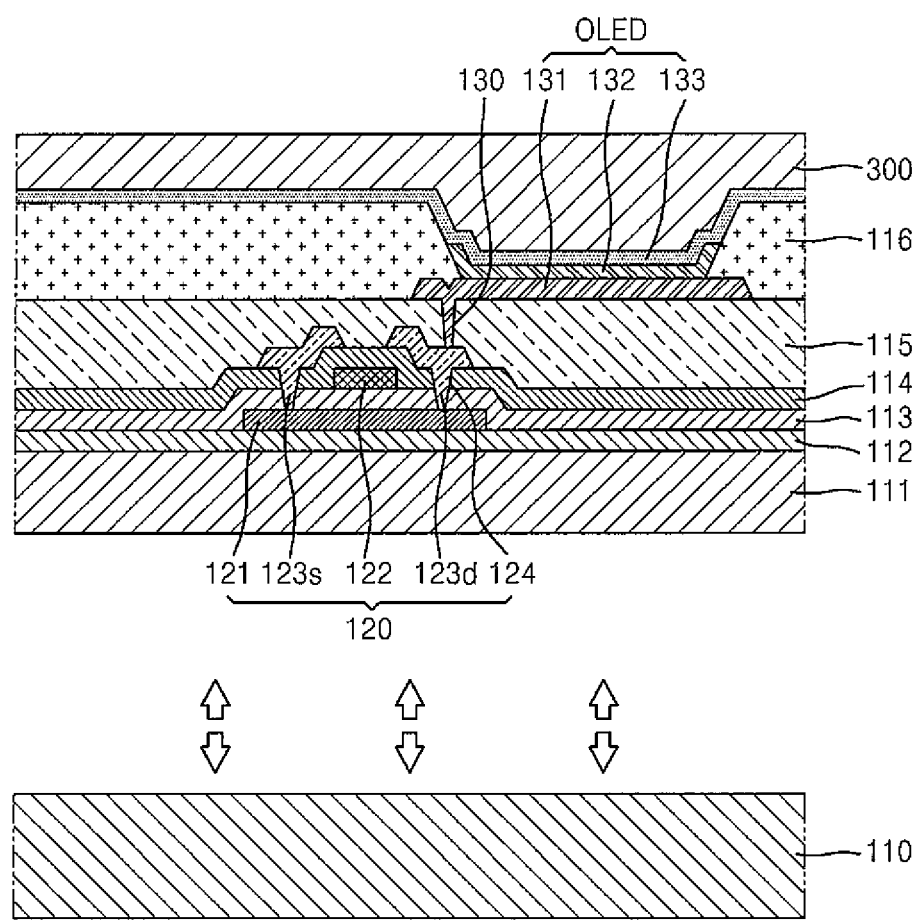

Referring to FIG. 10, the encapsulation layer 300 is formed on a top surface of the second electrode 133 so as to encapsulate the OLED. The encapsulation layer 300 may be a barrier layer formed of an inorganic material, an organic material, or a multi-stack including organic and inorganic materials.

In a case where the encapsulation layer 300 is a thin-film encapsulation layer having a multi-thin layer structure in which an inorganic layer and an organic layer are sequentially stacked, the inorganic layer may perform protection and moisture-proofing, and the organic layer may perform planarization and defect filling.

The organic layer may be formed as an organic insulating layer including polymer derivatives such as commercially available PMMA or PS having a phenol group, an acryl-based polymer, an imide-based polymer, an allyl ether-based polymer, an amide-based polymer, a fluorine-based polymer, a p-xylene-based polymer, a vinylalcohol-based polymer, or a combination thereof.

The inorganic layer may be formed as an inorganic insulating layer including $SiO_2$, SiNx, SiON, $Al_2O_3$, $TiO_2$, $Ta_2O_5$, $HfO_2$, $ZrO_2$, BST, PZT, and/or the like. A stacking order of the inorganic layer and the organic layer may be switched. Also, the encapsulation layer 300 may have a multi-stack structure including one or more inorganic layers and one or more organic layers.

In a next delamination process, the supporting substrate 110 is delaminated from the stage 200 (refer to FIG. 9), and then the flexible substrate 111 and the supporting substrate 110 are delaminated from each other. The delamination process may be performed by using (utilizing) a physical tool or a hand.

Next, a cutting process is performed for each of the panels.

The method of manufacturing the flexible display device according to the present embodiment reduces or prevents a high delamination electrification voltage that occurs when the supporting substrate 110 is laminated to the stage 200 (refer to FIG. 9) and then is delaminated from the stage 200.

In order to reduce or prevent the high delamination electrification voltage, the method described with reference to FIGS. 3 through 10 may include doping a dopant on the flexible substrate 111a (refer to FIG. 3), so that a work function value of the flexible substrate 111 (refer to FIG. 4) may be equal or similar to a work function value of the supporting substrate 110.

As described above, according to the flexible display device and the method of manufacturing the flexible display device according to the one or more of the above embodiments of the present invention, a work function of a flexible substrate may be controlled so that a defect due to delamination electrification may be reduced or prevented, and a process reliability may be increased.

It should be understood that the example embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and equivalents thereof.

What is claimed is:

1. A flexible display device comprising:
a flexible substrate comprising a plastic insulating material and a dopant doped into the plastic insulating material to control a work function of the flexible substrate;
a display unit on the flexible substrate, and comprising a plurality of pixel circuit layers and a plurality of emission layers; and
an encapsulation layer to cover the display unit,
wherein the dopant is an inorganic n-type dopant or an inorganic p-type dopant.

2. The flexible display device of claim 1, wherein the work function of the flexible substrate is controlled by adjusting a type of the dopant and a concentration of the dopant.

3. The flexible display device of claim 1, wherein each of the plurality of emission layers is formed in a manner that a first electrode, an organic layer, and a second electrode are sequentially stacked.

4. The flexible display device of claim 1, wherein the flexible substrate comprises at least one material selected from polyethylene ether phthalate, polyethylene naphthalate, polycarbonate, polyarylate, polyetherimide, polyether sulfone, and polyimide.

5. The flexible display device of claim 1, further comprising a buffer layer between the flexible substrate and the display unit.

6. A method of manufacturing a flexible display device, the method comprising:
disposing a flexible substrate on a stage;
doping a dopant on the flexible substrate;
forming a display unit comprising a plurality of pixel circuit layers and a plurality of emission layers on the flexible substrate doped with the dopant;
forming an encapsulation layer to cover the display unit; and
delaminating the flexible substrate from the stage,
wherein the flexible substrate comprises a plastic insulating material and the dopant doped into the plastic insulating material to control a work function of the flexible substrate, and
wherein the dopant is an inorganic n-type dopant or an inorganic p-type dopant.

7. The method of claim 6, wherein the doping of the dopant comprises controlling a work function of the flexible substrate by adjusting a type of the dopant and a concentration of the dopant.

8. The method of claim 6, wherein the flexible substrate comprises at least one material selected from polyethylene ether phthalate, polyethylene naphthalate, polycarbonate, polyarylate, polyetherimide, polyether sulfone, and polyimide.

9. The method of claim 6, wherein the disposing of the flexible substrate comprises:
disposing a supporting substrate on the stage; and
disposing the flexible substrate on the supporting substrate.

10. The method of claim 9, wherein the doping of the dopant comprises doping the dopant on the flexible substrate to substantially equalize a work function of the flexible substrate with a work function of the supporting substrate.

11. The method of claim 9, wherein, when a work function of the flexible substrate is greater than a work function of the supporting substrate, the doping of the dopant comprises decreasing the work function of the flexible substrate by doping the n-type dopant on the flexible substrate.

12. The method of claim 9, wherein, when a work function of the flexible substrate is less than a work function of the supporting substrate, the doping of the dopant comprises increasing the work function of the flexible substrate by doping the p-type dopant on the flexible substrate.

13. The method of claim 9, wherein the supporting substrate comprises a glass substrate.

14. The method of claim 6, wherein each of the plurality of emission layers is formed in a manner that a first electrode, an organic layer, and a second electrode are sequentially stacked.

15. The method of claim 14, wherein the first electrode is an anode, and the second electrode is a cathode.

16. The method of claim 6, wherein the encapsulation layer is formed of an organic layer stacked and alternating with an inorganic layer, or is formed of a multi-stack inorganic layer.

17. The method of claim 6, further comprising forming a buffer layer on the flexible substrate doped with the dopant, after the doping of the dopant on the flexible substrate and prior to the forming of the display unit.

* * * * *